US012222596B2

(12) United States Patent
Wang et al.

(10) Patent No.: US 12,222,596 B2
(45) Date of Patent: Feb. 11, 2025

(54) DISPLAY SUBSTRATE WITH A BONDING PAD INCLUDING CONDUCTIVE PARTS IN DIFFERENT LAYERS AND METHOD FOR MANUFACTURING THE SAME, DISPLAY DEVICE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Jinliang Wang, Beijing (CN); Rong Wu, Beijing (CN); Yang Wang, Beijing (CN); Wenchao Wang, Beijing (CN); Liangliang Li, Beijing (CN); Sangjin Park, Beijing (CN); Baoqiang Wang, Beijing (CN); Xin Fang, Beijing (CN); Anguo Hu, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 632 days.

(21) Appl. No.: 17/310,374

(22) PCT Filed: Oct. 23, 2020

(86) PCT No.: PCT/CN2020/123266
§ 371 (c)(1),
(2) Date: Jul. 29, 2021

(87) PCT Pub. No.: WO2022/082737
PCT Pub. Date: Apr. 28, 2022

(65) Prior Publication Data
US 2022/0317508 A1 Oct. 6, 2022

(51) Int. Cl.
*G02F 1/13* (2006.01)
*G02F 1/1335* (2006.01)
(Continued)

(52) U.S. Cl.
CPC ...... *G02F 1/133512* (2013.01); *G02F 1/1345* (2013.01); *H01L 27/124* (2013.01); *H01L 27/1259* (2013.01); *H01L 29/78633* (2013.01)

(58) Field of Classification Search
CPC ............. G02F 1/133512; G02F 1/1345; G02F 1/133354; G02F 1/134318; G02F 1/13439;
(Continued)

(56) References Cited

U.S. PATENT DOCUMENTS 6,559,913 B1   5/2003   Sera
9,136,315 B1 * 9/2015   Kim ........................ H10K 71/00
(Continued)

FOREIGN PATENT DOCUMENTS

CN   102279483 A   12/2011
CN   107407846 A   11/2017
(Continued)

*Primary Examiner* — Mohammad M Hoque
(74) *Attorney, Agent, or Firm* — Nath, Goldberg & Meyer; Joshua B. Goldberg

(57) ABSTRACT

A display substrate, a method for manufacturing a display substrate and a display device are provided. The display substrate has a display area and a bonding area. The display substrate includes a base, a first conductive layer, a light shielding layer, and bonding pads. The first conductive layer is on the base and in the display area, and the first conductive layer includes gate lines; the light shielding layer is on a side of the first conductive layer proximal to the base, and an orthographic projection of the light shielding layer on the base at least covers orthographic projections of the gate lines on the base; the bonding pads are on the base at intervals and (Continued)

in the bonding area, orthographic projections of at least a portion of the bonding pads on the base are not overlapped with the orthographic projection of the light shielding layer on the base.

9 Claims, 9 Drawing Sheets

(51) Int. Cl.
  *G02F 1/1345* (2006.01)
  *H01L 27/12* (2006.01)
  *H01L 29/786* (2006.01)

(58) Field of Classification Search
  CPC ........... G02F 1/136209; G02F 1/13452; H01L 27/124; H01L 27/1259; H01L 29/78633; G09F 9/30; G09G 3/36
  USPC .......................................................... 257/72
  See application file for complete search history.

(56) References Cited

U.S. PATENT DOCUMENTS

| | | | | |
|---|---|---|---|---|
| 2005/0117093 A1* | 6/2005 | Kim | ................... | G02F 1/133514 |
| | | | | 349/106 |
| 2006/0023135 A1* | 2/2006 | Park | ................... | G02F 1/136204 |
| | | | | 349/40 |
| 2006/0279207 A1* | 12/2006 | Kim | ...................... | G02F 1/1345 |
| | | | | 313/506 |
| 2013/0342771 A1* | 12/2013 | Kim | ..................... | G02B 5/3083 |
| | | | | 349/15 |

FOREIGN PATENT DOCUMENTS

| | | | | | |
|---|---|---|---|---|---|
| CN | 108122946 A | | 6/2018 | | |
| CN | 111081582 A | | 4/2020 | | |
| CN | 210626821 U | | 5/2020 | | |
| CN | 109300970 B | * | 9/2020 | ......... | H01L 27/3246 |
| CN | 108873520 B | * | 7/2021 | ....... | G02F 1/136204 |
| CN | 114255658 A | * | 3/2022 | ......... | G02F 1/13458 |
| JP | 2010250005 A | | 11/2010 | | |
| KR | 20080098242 A | * | 11/2008 | | |

* cited by examiner

001

002

DISPLAY SUBSTRATE WITH A BONDING PAD INCLUDING CONDUCTIVE PARTS IN DIFFERENT LAYERS AND METHOD FOR MANUFACTURING THE SAME, DISPLAY DEVICE

This is a National Phase Application filed under 35 U.S.C. 371 as a national stage of PCT/CN2020/123266, filed Oct. 23, 2020, the content of which is hereby incorporated by reference in its entirety.

TECHNICAL FIELD

The present disclosure relates to the field of display technology, and particularly relates to a display substrate, a method for manufacturing a display substrate and a display device.

BACKGROUND

With advancement of technology, in recent years, full screens have gradually moved into our field of vision. A display substrate of the full screen includes a display area and a bonding area, where the display area is provided with a plurality of gate lines, and the bonding area is provided with a plurality of bonding pads for coupling with external signals. Metal layers of the gate lines faces a display side of a display panel, and thus if external light is irradiated onto the gate lines, the external light is reflected by the gate lines, so that a display quality of a display device including the display substrate is affected by reflection of the light.

SUMMARY

The present disclosure is directed to at least one of technical problems in the related art, and provides a display substrate capable of preventing a gate line from reflecting light and avoiding abnormal identification of a bonding pad.

In a first aspect, an embodiment of the present disclosure provides a display substrate having a display area and a bonding area located on at least one side of the display area; where the display substrate includes:

a base;

a first conductive layer disposed on the base and in the display area; the first conductive layer includes a plurality of gate lines;

a light shielding layer disposed on a side of the first conductive layer proximal to the base, and an orthographic projection of the light shielding layer on the base at least covers an orthographic projection of the gate lines on the base; and a plurality of bonding pads disposed on the base at intervals and in the bonding area; orthographic projections of at least a portion of the bonding pads on the base are not overlapped with the orthographic projection of the light shielding layer on the base.

According to the display substrate provided by the embodiment of the disclosure, the light shielding layer is arranged below the gate lines, so that the gate lines can be effectively prevented from reflecting light; and since the light shielding layer is not arranged under at least a portion of the bonding pads, the bonding pads can be accurately identified when a quality of the bonding pads is detected from a side of the base away from the light shielding layer in a detection process.

In some examples, orthographic projections of the plurality of bonding pads on the base are all not overlapped with the orthographic projection of the light shielding layer on the base.

In some examples, the plurality of bonding pads are disposed in the first conductive layer, and are of the same material as the gate lines.

In some examples, the bonding pads each include a functional bonding pad and a redundant bonding pad;

an orthographic projection of the redundant bonding pad on the base is not overlapped with the orthographic projection of the light shielding layer on the base;

an orthographic projection of the functional bonding pad on the base is at least partially overlapped with the orthographic projection of the light shielding layer on the base.

In some examples, the display substrate further includes: an auxiliary electrode and a common electrode which are disposed on a side of the first conductive layer away from the base, and are sequentially arranged along a direction away from the base and electrically coupled to each other; orthographic projections of the auxiliary electrode and the common electrode on the base at least partially overlap with each other;

the redundant bonding pad includes a first conductive part and a second conductive part which are disposed on the side of the first conductive layer away from the base, and are electrically coupled to each other, the first conductive part and the common electrode are arranged in a same layer and are made of a same material, and the second conductive part and the auxiliary electrode are arranged in a same layer and are made of a same material.

In some examples, the functional bonding pad and the gate lines are disposed in a same layer and are made of a same material.

In some examples, the display substrate further has a frame sealing area disposed around the display area, and the bonding area is disposed on at least one side of the frame sealing area away from the display area; the display substrate further includes: a plurality of first marks disposed on the base and in the bonding area;

orthographic projections of the first marks on the base are not overlapped with the orthographic projection of the light shielding layer on the base.

In some examples, the first marks and the gate lines are arranged in a same layer and are made of a same material.

In some examples, the display substrate further includes: an auxiliary electrode and a common electrode which are disposed on the side of the first conductive layer away from the base, and are sequentially arranged along a direction away from the base and electrically coupled to each other; orthographic projections of the auxiliary electrode and the common electrode on the base at least partially overlap with each other;

each first mark includes a third conductive part and a fourth conductive part which are disposed on the side of the first conductive layer away from the base, and are electrically coupled to each other, and the third conductive part and the common electrode are arranged in a same layer and are made of a same material; the fourth conductive part and the auxiliary electrode are arranged in same layer and are made of a same material.

In some examples, the display substrate further includes a plurality of fan-out wires disposed on the base at intervals, and each fan-out wire is correspondingly coupled to one bonding pad, and each fan-out wire extends from the bonding area to the display area; the orthographic projection of the light shielding layer on the base covers orthographic projections of the fan-out wires on the base.

In a second aspect, an embodiment of the present disclosure further provides a method for manufacturing a display substrate which includes a display area and a bonding area located on at least one side of the display area; the method includes:

manufacturing a light shielding layer on a base;

removing a part of the light shielding layer in the bonding area;

manufacturing a first conductive layer on a side of the light shielding layer away from the base; and patterning the first conductive layer, to form a plurality of gate lines on a part of the first conductive layer in the display area, and form a plurality of bonding pads on a part of the first conductive layer in the bonding area.

In some examples, the patterning the first conductive layer, to form the plurality of gate lines on the part of the first conductive layer in the display area, and form the plurality of bonding pads on the part of the first conductive layer in the bonding area specifically include:

exposing and developing the first conductive layer, and the light shielding layer arranged on a side of the part of the first conductive layer in the display area proximal to the base through a mask plate manufactured according to patterns of the gate lines and the bonding pads, to form the gate lines and the bonding pads.

In a third aspect, an embodiment of the present disclosure further provides a method for manufacturing a display substrate which includes a display area and a bonding area located on at least one side of the display area; the method includes:

manufacturing a light shielding layer on a base;

forming a first conductive layer on the light shielding layer;

patterning the first conductive layer and the light shielding layer to form a plurality of gate lines at a part of the first conductive layer in the display area, and form a plurality of functional bonding pads at a part of the first conductive layer in the bonding area; and manufacturing a plurality of redundant bonding pads on a side of the first conductive layer away from the base.

In some examples, each redundant bonding pad includes a first conductive part and a second conductive part which are disposed on the side of the first conductive layer away from the base and electrically coupled to each other; the manufacturing the plurality of redundant bonding pads on the side of the first conductive layer away from the base specifically includes:

forming a second conductive layer on the side of the first conductive layer away from the base;

patterning the second conductive layer to form an auxiliary electrode at a part of the second conductive layer in the display area, and form the second conductive part of the redundant bonding pad at a part of the second conductive layer in the bonding area;

forming a third conductive layer on a side of the second conductive layer away from the base;

patterning the third conductive layer to form a common electrode at a part of the third conductive layer in the display area, and form the first conductive part of the redundant bonding pad at a part of the third conductive layer in the bonding area.

In a fourth aspect, an embodiment of the present disclosure further provides a display device, where the display device includes the display substrate described above.

DESCRIPTION OF EMBODIMENTS

Figure 1:
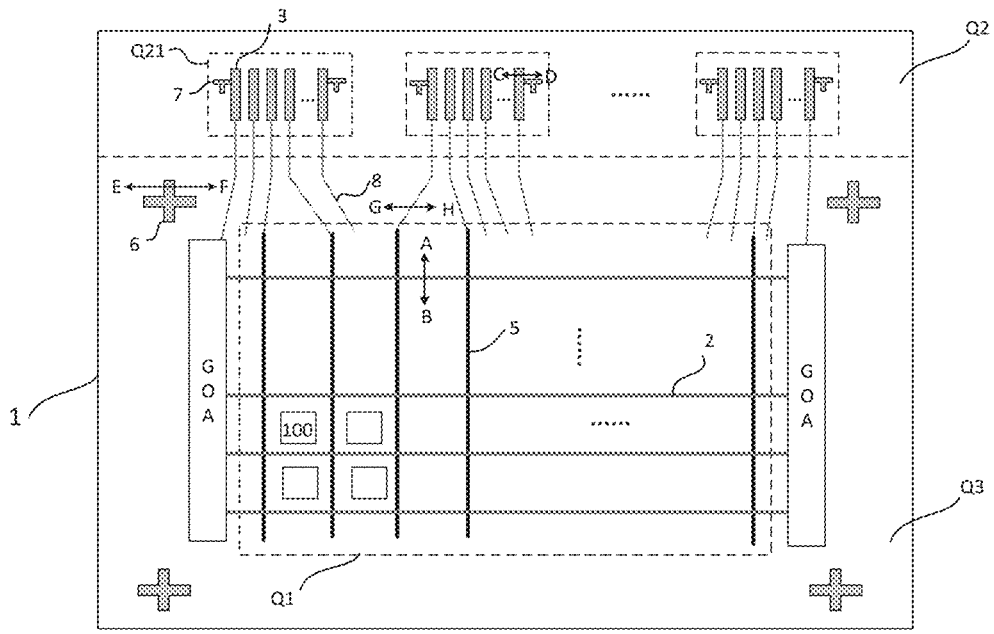
FIG. 1 is a schematic plan view illustrating a display substrate according to an embodiment of the present disclosure.

In order to make objectives, technical solutions and advantages of the present disclosure more apparent, the present disclosure will be described in further detail with reference to the accompanying drawings. All embodiments, which can be obtained by a person skilled in the art without making any creative effort based on embodiments described in the present disclosure, belong to a protection scope of the present disclosure.

Shapes and sizes of components in the drawings are not to scale, but are merely intended to facilitate an understanding of contents of the embodiments of the present disclosure.

Unless defined otherwise, technical or scientific terms used herein shall have the ordinary meaning as understood by one of ordinary skill in the art to which the present disclosure belongs. The use of "first", "second", and the like in the present disclosure is not intended to indicate any order, quantity, or importance, but rather is used to distinguish one element from another. Also, the use of the terms "a", "an", or "the" and similar referents do not denote a limitation of quantity, but rather denote a presence of at least one. The word "include" or "comprise", and the like, means that the element or item preceding the word contains the element or item listed after the word and its equivalent, but does not exclude other elements or items. The terms "connected" or "coupled" and the like are not restricted to physical or mechanical connections, but may include electrical connections, whether direct or indirect. Terms "upper", "on", "under", "below" and the like are used only to indicate relative positional relationships, and when an absolute position of an object being described is changed, the relative positional relationships may be changed accordingly.

The embodiments of the present disclosure are not limited to the embodiments shown in the drawings, but include modifications of configurations formed based on a manufacturing process. Thus, areas illustrated in the figures have schematic properties, and shapes of the areas shown in the figures illustrate specific shapes of the areas of elements, but are not intended to be limiting.

As shown in FIG. 1, FIG. 1 illustrates a top view of an example of a display substrate according to an embodiment of the present disclosure, the display substrate having a display area Q1, and a bonding area Q2 on at least one side of the display area Q1. The display area Q1 has a plurality of sub-pixels 100 arranged in an array therein, and the bonding area Q2 has a plurality of bonding pads 3 therein, and the bonding pads 3 are configured to receive signals transmitted by an external driving integrated circuit and transmit the signals to the sub-pixels 100 in the display area. The display substrate further includes a plurality of gate lines 2 extending in a first direction, and a plurality of data lines 5 extending in a second direction, the gate lines 2 crossing the data lines 5 to define areas of the sub-pixels 100. In the following embodiment, a case where the first direction is a row direction of the sub-pixels 100 arranged in the array and the second direction is a column direction of the sub-pixels 100 arranged in the array is taken as an example.

It should be noted that the display substrate may further include a frame sealing area Q3, the frame sealing area Q3 is disposed around the display area Q1, the bonding area Q2 is disposed on at least one side of the frame sealing area Q3 away from the display area Q1, and the frame sealing area Q3 is configured for disposing frame sealing glue to seal the display substrate and a color filter substrate when they are aligned and combined. In addition, the frame sealing area Q3 may be further provided with a driving integrated circuit, such as a Gate On Array (GOA). The GOA may be disposed at any end of each gate line 2, and the gate line 2 is coupled to the GOA at the end thereof to receive a scanning signal transmitted by the GOA. The display substrate may be provided with the GOA on a single side, that is, the GOA is provided at only one end of the gate line 2, or may be provide with GOAs on both sides, that is, the GOAs are provided at both ends of the gate line 2, which is not limited herein. In the embodiment of the present disclosure, the display substrate is described by taking a case where the GOAs are disposed on both sides.

Note that, the bonding area Q2 of the display substrate may be located at different positions according to different locations of the driving integrated circuit, and for example, if the gate line 2 is driven by a gate driving integrated circuit (G-IC), and a data line 5 is driven by a source driving integrated circuit (S-IC), two sides of the display substrate opposite to two ends of the gate line 2 and one side of the display substrate opposite to any one end of the data line 5 may be taken as the bonding area Q2. If the gate line 2 is driven by the GOA, only one side of the display substrate opposite to any one end of the data line 5 is taken as the bonding area Q2. In the following, a case where the display substrate has one bonding area Q2, and the bonding area Q2 is disposed on an upper side of the display substrate is taken as an example, but the embodiment of the present disclosure is not limited thereto.

Figure 2:
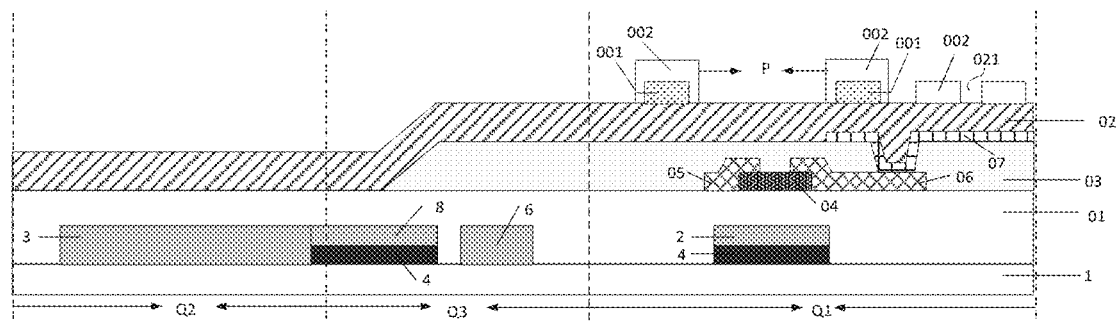
FIG. 2 is a cross-sectional view of a display substrate according to an embodiment of the present disclosure.

In a first aspect, referring to FIG. 1 and FIG. 2, FIG. 2 is an example of cross-sectional view of a display substrate provided in the embodiment, the display substrate provided in the embodiment of the present disclosure includes a base 1, and a first conductive layer on the base 1, where the first conductive layer is located in the display area Q1, the first conductive layer includes a plurality of gate lines 2, and the plurality of gate lines 2 are coupled to GOAs on two sides thereof. The display substrate further includes a light shielding layer 4 arranged on a side of the first conductive layer proximal to the base 1, since the gate lines 2 reflect external light when the external light is irradiated thereon, a phenomenon in which a display side of a display device including the display substrate reflect light occurs, consequently, the light shielding layer 4 arranged on a side of the gate lines 2 proximal to the base 1 can avoid the phenomenon of reflection caused by the gate lines 2, that is to say, an orthographic projection of the light shielding layer 4 on the base 1 covers at least orthographic projections of the gate lines 2 on the base 1.

Further, with continued reference to FIG. 1 and FIG. 2, the display substrate further includes a plurality of bonding pads 3, the plurality of bonding pads 3 are disposed on the base 1 at intervals, and the plurality of bonding pads 3 are located in the bonding area Q2, the bonding area Q2 includes a plurality of sub-areas Q21 disposed side by side, each sub-area Q21 corresponds to one connector, that is, the plurality of bonding pads 3 are divided into a plurality of groups, each sub-area Q21 is provided therein with one group of bonding pads 3, the bonding pads 3 are exposed electrodes, first ends of the bonding pads 3 in each group are coupled to and packaged with pins of one connector, second ends of the bonding pads 3 in each group are coupled to data lines 5 or the GOA in the display area Q1, and an external integrated driving circuit (e.g., a source driving circuit) is coupled to the pins of the connector, and transmits signals to the bonding pads 3 through the connector. The connector may be any of various types of connectors, such as a Chip On Flex (COF) connector or a Chip On Glass (COG) connector, and each group of bonding pads 3 are pressed against the connector by using anisotropic conductive film (ACF) adhesive and are electrically coupled with the connector through conductive gold balls in the ACF adhesive. Taking an exemplary of the display substrate as an example, the bonding pads 3 are usually disposed in the same layer and made of the same material as the gate lines 2, that is, the bonding pads 3 are disposed in the first conductive layer and made of the same film as the gate lines 2, and thus usually, the light shielding layer 4 is formed on the base 1, the first conductive layer is formed on the side of the light shielding layer 4 away from the base 1, and then the first conductive layer is patterned to form the gate lines 2 and the bonding pads 3, so that the light shielding layer 4 is also disposed below the bonding pads 3. In the process of manufacturing the display substrate, pressing qualities of the bonding pads 3 need to be detected, specifically, a camera takes an image of the bonding pads 3 from a side of the base 1 away from the bonding pads 3 to observe the number of particles pressed by the ACF adhesive, but the bonding pads 3 cannot be observed due to the light shielding layer 4 arranged between the bonding pads 3 and the base 1. In order to solve the above problem, in the display substrate provided in the present disclosure, orthogonal projections of at least a portion of the bonding pads 3 on the base 1 are not overlapped with an orthogonal projection of the light shielding layer 4 on the base 1. Therefore, if the orthographic projections of all the bonding pads 3 on the base 1 are not overlapped with the orthographic projection of the light shielding layer 4 on the base 1, that is, the light shielding layer 4 is not arranged under the bonding pads 3 (as shown in FIG. 2), the camera can observe the pressing quality of each bonding pad 3 from the side of the base 1 away from the bonding pads 3; if the orthographic projections of a portion of the bonding pads 3 on the base 1 are not overlapped with the orthographic projection of the light shielding layer 4 on the base 1, that is, the light shielding layer 4 is not arranged under the portion of the bonding pads 3, the camera can observe the pressing qualities of the bonding pads 3 without the light shielding layer 4 therebelow from the side of the base 1 away from the bonding pads 3, and a difference between the pressing qualities of the bonding pads 3 is relatively small because the bonding pads 3 are pressed by a same process, so that the pressing qualities of all the bonding pads 3 can be determined according to the pressing qualities of the portion of the bonding pads 3.

Figure 3:
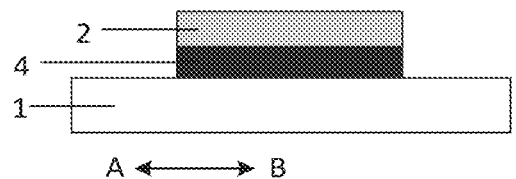
FIG. 3 is a cross-sectional view taken along a line A-B in FIG. 1.
Figure 4:
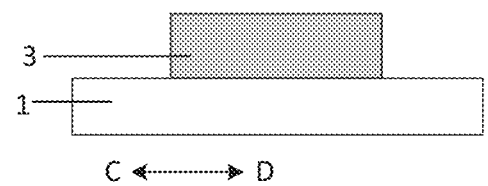
FIG. 4 is a cross-sectional view taken along a line C-D in FIG. 1.
Figure 5:
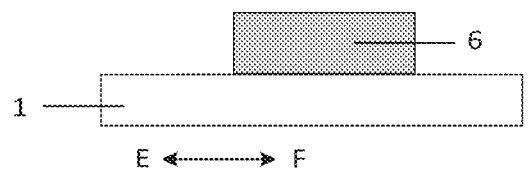
FIG. 5 is a cross-sectional view taken along a line E-F in FIG. 1.
Figure 6:
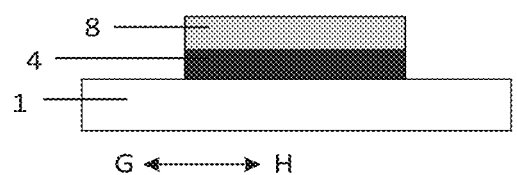
FIG. 6 is a cross-sectional view taken along a line G-H in FIG. 1.

In some examples, taking observing the pressing qualities of all the bonding pads 3 as an example, referring to FIGS. 1 to 6, the orthographic projections of all the bonding pads 3 on the base 1 are not overlapped with the orthographic projection of the light shielding layer 4 on the base 1. Specifically, the bonding pads 3 are disposed in the first conductive layer, that is, the bonding pads 3 and the gate lines 2 are disposed in a same layer and have a same material, but the light shielding layer 4 is further disposed between the gate lines 2 and the base 1, but the bonding pads 3 are directly formed on the base 1. Referring to FIG. 3, FIG. 3 is a cross-sectional view taken along a line A-B in FIG. 1 at the gate lines 2 in the display area Q1, and the light shielding layer 4 is disposed between the gate lines 2 and the base 1 to prevent the gate lines 2 from reflecting light. Referring to FIG. 4, FIG. 4 is a cross-sectional view taken along a line C-D at the bonding pads 3 in the bonding area Q2, the light shielding layer 4 is not disposed between the bonding pads 3 and the base 1, the bonding pads 3 are made of the same material as the gate lines 2, and are directly formed on the base 1. Therefore, the pressing quality of each bonding pad 3 can be observed directly from the side of the base 1 away from the bonding pads 3.

In some examples, referring to FIGS. 1 to 6, the display substrate further includes a gate insulating layer 01 disposed on a side of the first conductive layer (the layer where the bonding pads 3 and the gate lines 2 are located) away from the base 1; an active layer 04 is arranged on a side of the gate insulating layer 01 away from the base 1; a source electrode 05 and a drain electrode 06 are arranged on a side of the active layer 04 away from the base 1, the source electrode 05 and the drain electrode 06 are arranged in a same layer and are made of a same material, a gate electrode, the gate insulating layer 01, the active layer 04, the source electrode 05 and the drain electrode 06 form a thin film transistor, each film layer of the thin film transistor is only arranged in the display area Q1, it needs to be noted that, the gate electrode of the thin film transistor and the gate lines 2 are formed in a same film layer, the gate line 2 is coupled to the gate electrode, and a reference sign 2 in FIG. 2 indicates a position of the gate electrode; in the display substrate, each sub-pixel 100 has a thin film transistor, one gate line 2 is coupled to thin film transistors of the sub-pixels 100 in a same row, and one data line 5 is coupled to thin film transistors of the sub-pixels 100 in a same column; a planarization layer 03 is arranged on a side of the source electrode 05 and the drain electrode 06 away from the base 1, the planarization layer 03 may be an organic film (ORG film), and the planarization layer 03 flattens a top layer of the thin film transistors for facilitating to form a subsequent film layer; a pixel electrode 07 is arranged on a side of the planarization layer 03 away from the base 1, and the pixel electrode 07 is coupled to the drain electrode 06 through a via hole in the planarization layer 03; a protective layer 02 is arranged on a side of the pixel electrode 07 away from the base 1 for protecting each film layer of the thin film transistors.

In some examples, referring to FIG. 2, a common electrode 002 is arranged on a side of the protective layer 02 of the display substrate away from the base 1, and is located in the display area Q1, the common electrode 002 is disposed opposite to the pixel electrode 07, an orthogonal projection of the common electrode 002 on the base 1 and an orthogonal projection of the pixel electrode 07 on the base 1 have an overlapping area, the common electrode 002 receives a common voltage, the pixel electrode 07 receives a data voltage provided by the data line 5, thereby an electric field is generated between the common electrode 002 and the data line 5, and if the display substrate and the color filter substrate are aligned and combined to form a display device, and liquid crystal is poured between the display substrate and the color filter substrate, the electric field between the common electrode 002 and the data line 5 can change deflection angles of liquid crystal molecules in the liquid crystal, accordingly, a transmittance of light can be changed, and thus, the display device can emit light of a desired gray scale by controlling a voltage difference between the common electrode 002 and the pixel electrode 07.

Figure 7:
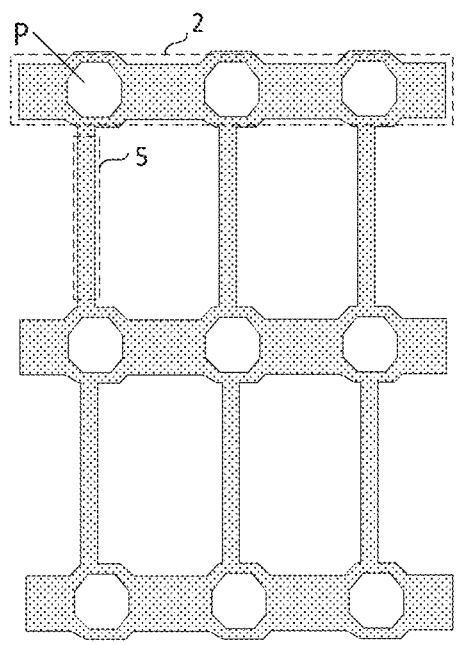
FIG. 7 is a schematic plan view illustrating an auxiliary electrode of a display substrate according to an embodiment of the present disclosure.
Figure 8:
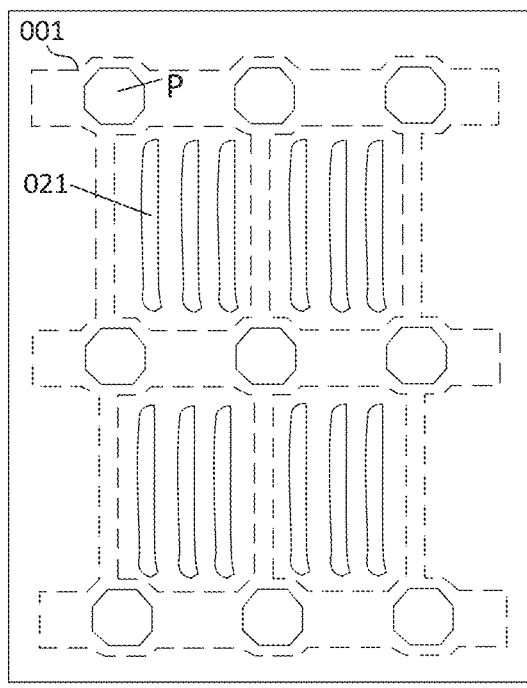
FIG. 8 is a schematic plan view of a common electrode of a display substrate according to an embodiment of the present disclosure.

In some examples, referring to FIGS. 2 and 8, FIG. 8 is a top view illustrating a part of the common electrode 002 covering the sub-pixels 100 arranged in 3×3 array, the common electrode 002 and an auxiliary electrode 001 are both disposed in the display area Q1, the common electrode 002 is a planar electrode, the common electrode 002 has a plurality of slits 021, and an electric field can be formed between the pixel electrode 07 and the common electrode 002 through the slits 021. In order to increase aperture ratios of the sub-pixels 100 and brightness of the sub-pixels 100, pixel openings P may be disposed in areas of the common electrode 002 corresponding to the sub-pixels 100, so as to expose the thin film transistors of the sub-pixels 100, that is, orthographic projections of the pixel openings P on the base 1 coincide with orthographic projections of the thin film transistors (especially, gate electrodes) on the base 1. The common electrode 002 and the pixel electrode 07 each may be made of indium tin oxide (ITO) to increase a light transmittance of the sub-pixels 100, but the ITO has a relatively large resistivity, which may cause a difference in magnitude of common voltage on the common electrode 002 at the sub-pixels 100 of the display substrate, therefore, in order to reduce a resistance of the common electrode 002, the auxiliary electrode 001 may be disposed on a side of the common electrode 002 proximal to the base 1, the auxiliary electrode 001 and the common electrode 002 are stacked, as shown in FIG. 7, FIG. 7 is a top view of a part of the auxiliary electrode 001 covering the sub-pixels 100 arranged in 3×3 array, the auxiliary electrode 001 is disposed around the pixel openings P of the corresponding common electrode 002, and the auxiliary electrode 001 covers the gate lines 2 and the data lines 5, so as to reduce resistances of the gate lines 2 and the data lines 5, and reduce signal loss.

In some examples, referring to FIG. 2, the auxiliary electrode 001 is only disposed under a partial area of the common electrode 002, and the common electrode 002 wraps the auxiliary electrode 001, that is, the common electrode 002 covers a top surface and side surfaces of the auxiliary electrode 001, so that during manufacturing the display substrate, a film layer of the auxiliary electrode 001 is formed on the side of the protective layer 02 away from the base 1, the auxiliary electrode 001 is formed by patterning the film layer, and a film layer of the common electrode 002 is formed, then the common electrode 002 is formed by patterning the film layer, the patterning including exposure, development and etching processes, since a developing solution for developing the common electrode 002 is corrosive to the auxiliary electrode 001, in order to prevent the developing solution from affecting the auxiliary electrode 001 during developing the common electrode 002, the common electrode 002 may wrap the auxiliary electrode 001.

In some examples, referring to FIG. 1 to FIG. 6, the display substrate provided in the embodiment of the present disclosure further includes a plurality of first marks 6 disposed in the frame sealing area Q3, and the plurality of first marks 6 are disposed in the frame sealing area Q3, for example, may be disposed at four corners of the frame sealing area Q3, so that when the display substrate and the color filter substrate are aligned and combined, alignment can be performed through the first marks 6. Similarly, taking an exemplary of the display substrate as an example, the first marks 6 are usually disposed in the same layer and made of the same material as the gate lines 2, that is, the first marks 6 are disposed in the first conductive layer and made of the same film as the gate lines 2, so that the light shielding layer 4 is usually formed on the base 1, the first conductive layer is formed on the side of the light shielding layer 4 away from the base 1, and then the first conductive layer is patterned to form the gate lines 2, the first marks 6, and the bonding pads 3, so that the light shielding layer 4 is also disposed below the first marks 6. In the process of manufacturing the display substrate, the first marks 6 need to be identified from the side of the base 1 away from the first marks 6, but the light shielding layer 4 is arranged between the first marks 6 and the base 1, so that the first marks 6 cannot be identified. In order to solve the above problem, in the display substrate provided in the present disclosure, orthographic projections of the first marks 6 on the base 1 are not overlapped with the orthographic projection of the light shielding layer 4 on the base 1 (as shown in FIG. 2), so that a camera can identify each of the first marks 6 from the side of the base 1 away from the first marks 6.

In some examples, taking a case where all the first marks 6 can be identified as an example, referring to FIGS. 1 to 6, FIG. 5 is a cross-sectional view taken along a line E-F in FIG. 1 at the first marks 6 in the frame sealing area Q3, and the orthographic projections of all the first marks 6 on the base 1 are not overlapped with the orthographic projection of the light shielding layer 4 on the base 1. Specifically, the first marks 6 are arranged in the first conductive layer, that is, the first marks 6 and the gate lines 2 are arranged in a same layer and have a same material, but the light shielding layer 4 is further arranged between the gate lines 2 and the base 1, the first marks 6 are directly formed on the base 1, so that each first mark 6 can be directly and accurately identified from the side of the base 1 away from the first marks 6.

In some examples, referring to FIG. 1, the display substrate provided in the embodiment further includes a plurality of second marks 7, each sub-area Q21 is provided therein with one group of bonding pads 3, each group of bonding pads 3 are coupled to one connector, each group of bonding pads 3 are coupled to two second marks 7, and specifically, the second marks 7 are respectively coupled to outer sides of two outermost bonding pads in each group of bonding pads 3, so as to determine a pressing bonding state of the conductive gold balls in the ACF adhesive after the connector is bonded to the bonding pads 3. The structure of the second marks 7 is the same as that of the first marks 6, and orthographic projections of the second marks 7 on the base 1 is also not overlapped with the orthographic projection of the light shielding layer 4 on the base 1, so that each second mark 7 can be accurately identified directly from the side of the base 1 away from the second mark 7. Specifically, the second marks 7 are disposed in the first conductive layer, that is, the second marks 7 are disposed in the same layer and are made of the same material as the gate lines 2, but the light shielding layer 4 is further disposed between the gate lines 2 and the base 1, and the second marks 7 are directly formed on the base 1.

In some examples, referring to FIG. 1 and FIG. 2, the display substrate provided in the embodiment further includes a plurality of fan-out wires 8, the plurality of fan-out wires 8 are disposed on the base 1 at intervals, each fan-out wire 8 is correspondingly coupled to one bonding pad 3, one end of the fan-out wire 8 is coupled to one bonding pad 3 (as shown in FIG. 2), and the other end of the fan-out wire 8 extends from the bonding area Q2 to the display area Q1 and is coupled to the GOA or the data line 5 in the display area Q1. The film layer structure of the fan-out lines 8 is the same as that of the gate lines 2, that is, the orthographic projection of the light shielding layer 4 on base 1 covers orthographic projections of the fan-out wires 8 on base 1. Specifically, the fan-out wires 8 and the gate lines 2 are arranged in a same layer and are made of a same material, and the light shielding layer 4 is further arranged between the fan-out wires 8 and the base 1.

In summary, in the display substrate provided in the embodiment of the present disclosure, the film structure of the marks such as the first marks 6 and the second marks 7 is the same as that of the bonding pads 3, and orthographic projections of the first marks 6 and the second marks 7 on the base 1 are not overlapped with the orthographic projection of the light shielding layer 4 on the base 1; the film layer structure of the fan-out wires 8 is the same as that of the gate lines 2, and the orthographic projections of the fan-out wires 8 on the base 1 are overlapped with the orthographic projection of the light shielding layer 4 on the base 1. The first marks 6 may include any mark disposed in the frame sealing area Q3, for example, the first marks 6 may be at least one of a cutting mark, a grinding mark, a process mark, an overlapping mark, and a total pitch mark.

In some examples, a shape of each of the marks such as the first marks 6 or the second marks 7 may be any of various shapes, such as a cross shape, a T shape, a rectangle shape, a circle shape, a triangle shape, and the like, and in the embodiment of the present disclosure, a case where the shape of the first mark 6 is cross, and the shape of the second mark 7 is a T shape is taken as an example, but the present disclosure is not limited thereto.

In some examples, in the display substrate provided in the embodiment of the present disclosure, the light shielding layer 4 may be made of any of various materials, for example, the light shielding layer 4 may be made of molybdenum oxide, the molybdenum oxide is black, and can effectively absorb light irradiated onto the gate lines 2.

Certainly, the light shielding layer 4 may be made of other materials, which is not limited herein.

Figure 9:
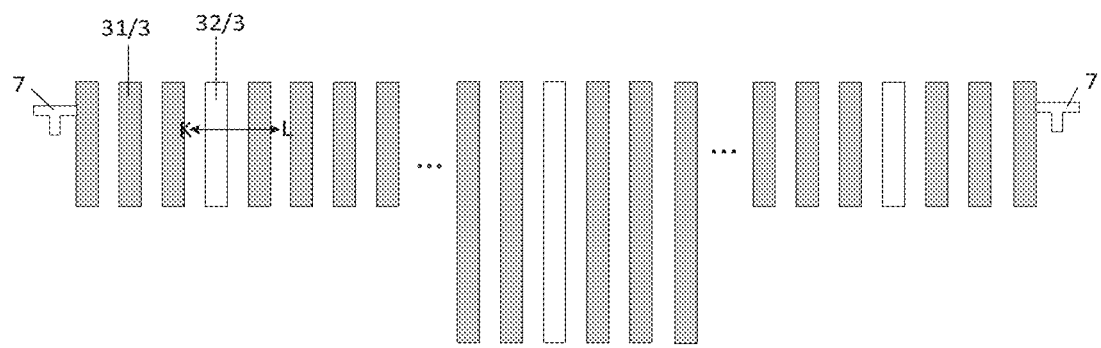
FIG. 9 is a schematic distribution diagram of a portion of bonding pads in a display substrate according to an embodiment of the present disclosure.
Figure 10:
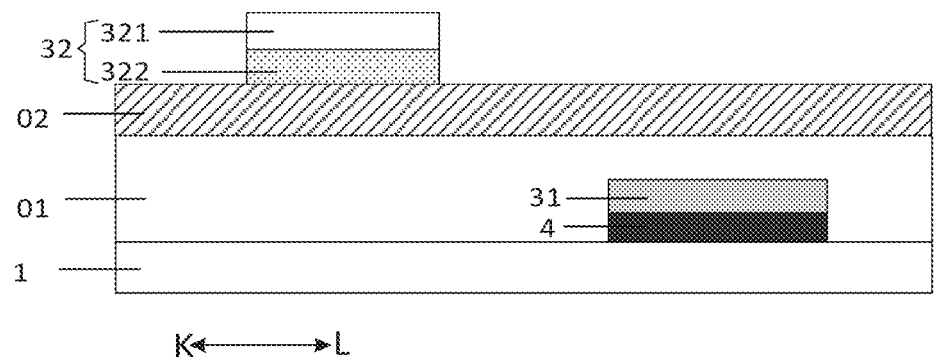
FIG. 10 is a cross-sectional view taken along a line K-L in FIG. 9.

In some examples, the pressing qualities of a portion of the bonding pads 3 are observed, and as shown in FIGS. 9 and 10, FIG. 9 is an exemplary distribution diagram of the bonding pads to which one connector is coupled, and FIG. 10 is a cross-sectional view taken along a line K-L in FIG. 9. In the display substrate provided in the embodiment, the bonding pads 3 in the bonding area Q2 include functional bonding pads 31 and redundant bonding pads (dummy leads) 32, the functional bonding pads 31 and the redundant bonding pads 32 are both disposed on the base 1, usually, external signals are input only to the functional bonding pads 31, that is, pins of the connector are coupled only to the functional bonding pads 31, and the functional bonding pads 31 are further coupled to the data lines 5 or GOA in the display area Q1, or coupled through the fan-out wires 8, and the redundant bonding pads 32 are dummy electrodes and are not coupled to the pins of the connector, and do not receive any electrical signal. Since the signals received by the functional bonding pads 31 include positive and negative signals (e.g., positive and negative data voltages input to the data lines 5), in order to ensure that no crosstalk occurs in the signals between the functional bonding pads 31 receiving the positive and negative signals, at least one dummy redundant bonding pad 32 is provided between the functional bonding pad 31 receiving the positive signal and the functional bonding pad 31 receiving the negative signal for separating the functional bonding pad 31 receiving the positive signal from the functional bonding pad 31 receiving the negative signal, and the redundant bonding pad 32 itself does not receive any electrical signal, so that the redundant bonding pads 32 may be formed in a different film layer from the functional bonding pads 31 to have a different layer structure. Specifically, referring to FIG. 10, orthographic projections of the redundant bonding pads 32 on the base 1 are not overlapped with the orthographic projection of the light shielding layer 4 on the base 1, and orthographic projections of the functional bonding pads 31 on the base 1 at least partially overlaps with the orthographic projection of the light shielding layer 4 on the base 1, that is, the light shielding layer 4 is disposed only under the functional bonding pads 31 in the bonding area Q2, and the light shielding layer 4 is not disposed under the redundant bonding pads 32. It should be noted that, the light shielding layer 4 is disposed on the side of the functional bonding pads 31 proximal to the base 1, and the pattern of the light shielding layer 4 may be consistent with the patterns of the functional bonding pads 32, that is, the orthographic projections of the functional bonding pads 31 on the base 1 may completely overlap with the orthographic projection of the light shielding layer 4 on the base 1. Therefore, the pressing quality of each redundant bonding pad 32 can be observed from the side of the base 1 away from the bonding pads 3, and the entire pressing qualities of the functional bonding pads 31 and redundant bonding pads 32 can be determined by observing the pressing qualities of the redundant bonding pads 32.

Figure 11:
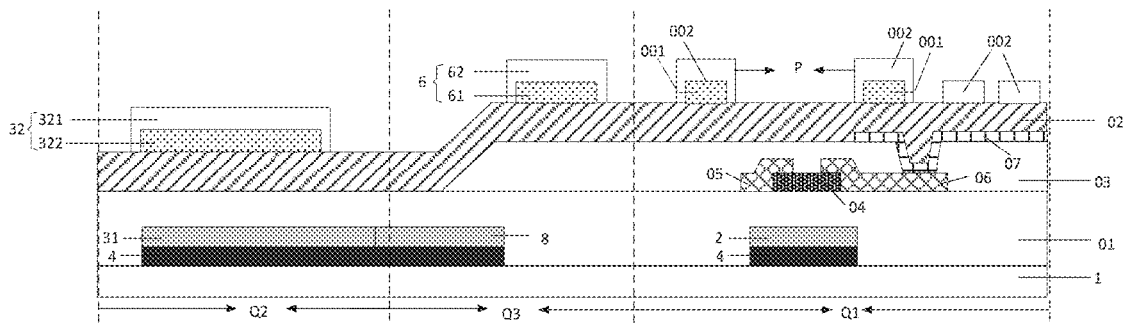
FIG. 11 is a cross-sectional view of a display substrate according to an embodiment of the present disclosure.

In some examples, since the redundant bonding pads 32 do not receive any electrical signal, and thus it is not necessary to consider wiring thereof, the redundant bonding pads 32 may be formed by using any conductive film layer in the display substrate. Taking the exemplary of the display substrate shown in FIG. 11 as an example, FIG. 11 is a cross-sectional view of the display substrate corresponding to the embodiment of FIG. 9, and first, film structures of the display substrate will be described. The display substrate includes a base 1, a light shielding layer 4 arranged on the base 1, and a first conductive layer arranged on a side of the light shielding layer 4 away from the base 1, a part of the first conductive layer located in the display area Q1 includes a plurality of gate lines 2, a part of the first conductive layer located in the bonding area Q1 includes a plurality of function bonding pads 31, an orthographic projection the light shielding layer 4 on base 1 covers orthographic projections of the gate lines 2 and the function bonding pads 31 on base 1, the light shielding layer 4 is arranged on a side of the gate lines 2 proximal to the base 1, and can prevent the gate lines 2 from reflecting light. The display substrate further includes a gate insulating layer 01 arranged on a side of the first conductive layer (the layer where the functional bonding pads 31 and the gate lines 2 are located) away from the base 1; an active layer 04 is arranged on a side of the gate insulating layer 01 away from the base 1; a source electrode 05 and a drain electrode 06 are arranged on a side of the active layer 04 away from the base 1, the source electrode 05 and the drain electrode 06 are arranged in a same layer and are made of a same material, a gate electrode, the gate insulating layer 01, the active layer 04, the source electrode 05 and the drain electrode 06 form a thin film transistor, each film layer of the thin film transistor is only arranged in the display area Q1, it needs to be noted that the gate electrode of the thin film transistor and the gate lines 2 are formed in a same film layer, the gate line 2 is coupled to the gate electrode, and the reference sign 2 in FIG. 2 indicates a position of the gate electrode; in the display substrate, each sub-pixel 100 has a thin film transistor, one gate line 2 is coupled to thin film transistors of the sub-pixels 100 in a same row, and one data line 5 is coupled to thin film transistors of the sub-pixels 100 in a same column; a planarization layer 03 is arranged on a side of the source electrode 05 and the drain electrode 06 away from the base 1, the planarization layer 03 may be an organic film (ORG film), and the planarization layer 03 flattens a top layer of the thin film transistors for facilitating to form a subsequent film layer; a pixel electrode 07 is arranged on a side of the planarization layer 03 away from the base 1, and the pixel electrode 07 is coupled to the drain electrode 06 through a via hole in the planarization layer 03; a protective layer 02 is arranged on a side of the pixel electrode 07 away from the base 1 for protecting each film layer of the thin film transistors.

In some examples, referring to FIG. 2, a common electrode 002 is arranged on a side of the protective layer 02 of the display substrate away from the base 1, and is located in the display area Q1, the common electrode 002 is disposed opposite to the pixel electrode 07, an orthogonal projection of the common electrode 002 on the base 1 and an orthogonal projection of the pixel electrode 07 on the base 1 have an overlapping area, the common electrode 002 receives a common voltage, the pixel electrode 07 receives a data voltage provided by the data line 5, thereby an electric field is generated between the common electrode 002 and the data line 5, and if the display substrate and the color filter substrate are aligned and combined to form a display device, and liquid crystal is poured between the display substrate and the color filter substrate, the electric field between the common electrode 002 and the data line 5 can change deflection angles of liquid crystal molecules in the liquid crystal, accordingly, a transmittance of light can be changed, and thus, the display device can emit light of a desired gray scale by controlling a voltage difference between the common electrode 002 and the pixel electrode 07.

In some examples, referring to FIGS. 2 and 8, FIG. 8 is a top view of a portion of the common electrode 002 covering the sub-pixels 100 arranged in 3×3 array, the common electrode 002 and an auxiliary electrode 001 are both disposed in the display area Q1, the common electrode 002 is a planar electrode, the common electrode 002 has a plurality of slits 021, and an electric field can be formed between the pixel electrode 07 and the common electrode 002 through the slits 021. In order to increase aperture ratios of the sub-pixels 100 and brightness of the sub-pixels 100, pixel openings P may be disposed in areas of the common electrode 002 corresponding to the sub-pixels 100, so as to expose the thin film transistors of the sub-pixels 100, that is, orthographic projections of the pixel openings P on the base 1 coincide with orthographic projections of the thin film transistors (especially, gate electrodes) on the base 1. The common electrode 002 and the pixel electrode 07 may be made of indium tin oxide (ITO) to increase a light transmittance of the sub-pixels 100, but the ITO has a relatively large resistivity, which may cause a difference in magnitude of common voltage on the common electrode 002 at the sub-pixels 100 of the display substrate, therefore, in order to reduce a resistance of the common electrode 002, the auxiliary electrode 001 may be disposed at a side of the common electrode 002 proximal to the base 1, the auxiliary electrode 001 and the common electrode 002 are disposed at the side of the first conductive layer away from the base 1, and the auxiliary electrode 001 is electrically coupled to the common electrode 002, so that a cross section of the common electrode 002 is increased, a resistance thereof is reduced accordingly, as shown in FIG. 7, the auxiliary electrode 001 and the common electrode 002 are sequentially disposed along a direction away from the base 1, FIG. 7 is a top view of a portion of the auxiliary electrode 001 covering the sub-pixels 100 arranged in 3×3 array, the auxiliary electrode 001 is disposed around the pixel openings P in the corresponding common electrode 002, and the auxiliary electrode 001 covers the gate lines 2 and the data lines 5 to reduce resistances of the gate lines 2 and the data lines 5 and reduce signal loss.

In some examples, referring to FIG. 2, the auxiliary electrode 001 is only disposed under a partial area of the common electrode 002, and the common electrode 002 wraps the auxiliary electrode 001, that is, the common electrode 002 covers a top surface and side surfaces of the auxiliary electrode 001, so that during manufacturing the display substrate, a film layer of the auxiliary electrode 001 is formed on the side of the protective layer 02 away from the base 1, the auxiliary electrode 001 is formed by patterning the film layer, a film layer of the common electrode 002 is formed, and then the common electrode 002 is formed by patterning the film layer, the patterning including exposure, development and etching processes, and since a developing solution for developing the common electrode 002 is corrosive to the auxiliary electrode 001, in order to prevent the developing solution from affecting the auxiliary electrode 001 during developing the common electrode 002, the common electrode 002 may wrap the auxiliary electrode 001.

In some examples, with continued reference to FIG. 11, redundant bonding pads 32 may be prepared using an electrode layer in the same layer as the auxiliary electrodes 001, and an electrode layer in the same layer as the common electrode 002. Note that, in FIG. 11, for convenience of illustrating positional relationships of film layers where the functional bonding pads 31 and the redundant bonding pads 32 are located, the functional bonding pads 31 and the redundant bonding pads 32 are illustrated in a same cross-sectional view, but if one functional bonding pad 31 is cut, the redundant bonding pad 32 is not shown above the functional bonding pad 31, and if one redundant bonding pad 32 is cut, the functional bonding pad 31 is not shown below the redundant bonding pad 32, and the light shielding layer 4 is not shown. Specifically, each redundant bonding pad 32 includes a first conductive part 321 and a second conductive part 322 disposed on a side of the first conductive layer away from the base 1, where the first conductive part 321 is electrically coupled to the second conductive part 322, the first conductive part 321 located in the bonding area Q2 and the common electrode 002 located in the display area Q1 are disposed in a same layer and made of a same material, that is, the first conductive part 321 and the common electrode 002 are prepared by using a same film process; correspondingly, the second conductive part 322 located in the bonding area Q2 and the auxiliary electrode 001 located in the display area Q1 are arranged in a same layer and are made of a same material, that is, the second conductive part 322 and the auxiliary electrode 001 are prepared by a same film layer process, and the light shielding layer 4 is not arranged below the first conductive part 321 and the second conductive part 322 of the redundant bonding pad 32, so that the pressing qualities of the redundant bonding pads 32 can be observed from the side of the base 1 away from the redundant bonding pads 32 (also away from the functional bonding pads 31), and the entire pressing qualities of the bonding pads 3 (including the functional bonding pads 31 and the redundant bonding pads 32) are determined. Certainly, the redundant bonding pads 32 may be made of other conductive film layers, which is not limited herein.

In some examples, continuing to refer to FIG. 11, since the functional bonding pads 31 are to be coupled to the data lines 5 or signal lines of the data lines, the gate lines 2 or signal lines of the gate lines in the display area Q1, it needs to be manufactured by using a film layer below the pixel electrode 07, and specifically, the functional bonding pads 31 may be disposed in the first conductive layer, that is, the functional bonding pads 31 are disposed in the same layer and made of the same material as the gate lines 2 (and also the gate electrodes), and the light shielding layer 4 is disposed below the functional bonding pads 31. Certainly, the functional bonding pads 31 may be made of other conductive film layers, which is not limited herein.

In some examples, with continued reference to FIG. 11, as described above, the display substrate in the embodiment of the present disclosure further includes a plurality of first marks 6 arranged in the frame sealing area Q3, and in order to solve the problem that the first marks 6 cannot be identified from the side of the base 1 away from the first marks 6 due to the light shielding layer 4 being provided between the first marks 6 and the base 1, in the display substrate provided in the present disclosure, orthographic projections of the first marks 6 on the base 1 are not overlapped with the orthographic projection of the light shielding layer 4 on the base 1 (as shown in FIG. 2), specifically, in addition to that the first marks 6 are disposed in the first conductive layer, the first marks 6 may be prepared by using other conductive film layers, for example, the first mark 6 include a third conductive part 62 and a fourth conductive part 61 disposed on the side of the first conductive layer away from the base 1, and the third conductive part 62 and the fourth conductive part 61 are electrically coupled, the third conductive part 62 and the common electrode 002 are disposed in a same layer and made of a same material, that is, the third conductive part 62 and the common electrode 002 are prepared by a same film process, and the fourth conductive part 61 and the auxiliary electrode 001 are disposed in a same layer and made of a same material, that is, the fourth conductive part 61 and the auxiliary electrode 001 are prepared by a same film process. The light shielding layer 4 is not arranged under the third conductive part 62 and the fourth conductive part 61 of the first mark 6, so that each first mark 6 can be accurately identified directly from the side of the base 1 away from the first marks 6.

In some examples, referring to FIG. 1, the display substrate provided in the embodiment further includes a plurality of second marks 7, each sub-area Q21 is provided therein with one group of bonding pads 3, each group of bonding pads 3 are coupled to one connector, each group of bonding pads 3 are coupled to two second marks 7, and specifically, the second marks 7 are respectively coupled to outer sides of two outermost bonding pads 3 (functional bonding pads 31 or redundant bonding pads 32) in each group of bonding pads 3, so as to determine a pressing bonding state of the conductive gold balls in the ACF adhesive after the connector is bonded to the bonding pads 3. The structure of the second marks 7 is the same as that of the first marks 6, and orthographic projections of the second marks 7 on the base 1 are not overlapped with the orthographic projection of the light shielding layer 4 on the base 1, so that each second mark 7 can be accurately identified directly from the side of the base 1 away from the second marks 7. Specifically, the second mark 7 include a fifth conductive part and a sixth conductive part which are stacked, the fifth conductive part and the common electrode 002 are disposed in a same layer and are made of a same material, that is, the fifth conductive part and the common electrode 002 are prepared by a same film process, and the sixth conductive part and the auxiliary electrode 001 are disposed in a same layer and are made of a same material, that is, the sixth conductive part and the auxiliary electrode 001 are prepared by a same film process.

In some examples, referring to FIG. 1 and FIG. 11, the display substrate provided in the embodiment further includes a plurality of fan-out wires 8, the plurality of fan-out wires 8 are disposed on the base 1 at intervals, each fan-out wire 8 is correspondingly coupled to one functional bonding pad 31, one end of the fan-out wire 8 is coupled to one functional bonding pad 31 (as shown in FIG. 11), and the other end of the fan-out wire 8 extends from the bonding area Q2 to the display area Q1 and is coupled to the GOA or the data line 5 in the display area Q1. The film layer structure of fan-out lines 8 is the same as that of the gate lines 2, that is, the orthographic projection of the light shielding layer 4 on base 1 covers orthographic projections of the fan-out wires 8 on base 1. Specifically, the fan-out wires 8 and the gate lines 2 are arranged in a same layer and are made of a same material, and the light shielding layer 4 is further arranged between the fan-out wires 8 and the base 1.

In summary, in the display substrate provided in the embodiment of the present disclosure, the film structure of the marks such as the first marks 6 and the second marks 7 is the same as that of the redundant bonding pads 32, and the orthographic projections of the first marks 6 and the second marks 7 on the base 1 are not overlapped with the orthographic projection of the light shielding layer 4 on the base 1; the film layer structure of the fan-out wires 8 is the same as that of the gate lines 2 and the functional bonding pads 31, and the orthographic projections of the fan-out wires 8 on the base 1 are overlapped with the orthographic projection of the light shielding layer 4 on the base 1. The first marks 6 may include any mark disposed in the frame sealing area Q3, for example, may include at least one of a cutting mark, a grinding mark, a process mark, an overlapping mark, and a total pitch mark.

In some examples, in the display substrate provided in the embodiment of the present disclosure, the light shielding layer 4 may be made of any of various materials, for example, the light shielding layer 4 may be made of molybdenum oxide, the molybdenum oxide is black, and can effectively absorb light irradiated onto the gate lines 2. Certainly, the light shielding layer 4 may be made of other materials, which is not limited herein.

In some examples, the material of the gate lines 2 in the first conductive layer may be copper, molybdenum, niobium, aluminum, etc., and taking copper as an example of the material of the gate lines 2, a film thickness of the gate lines 2 (also the first conductive layer) may range from 1000 to 2000 angstroms (Å), and a film thickness of the light shielding layer 4 may range from 400 to 500 Å.

It should be noted that, in the present embodiment, the thin film transistor may be a top gate thin film transistor, and may also be a bottom gate thin film transistor, and a position of a structure (for example, the functional bonding pads 31) in the same layer as a film layer where the gate electrode of the thin film transistor is located (that is, the first conductive layer where the gate lines 2 are located) may vary with the position of the gate electrode. In the above description, a case where the thin film transistor is a bottom gate thin film transistor is taken as an example, but the present application is not limited thereto.

Figure 12:
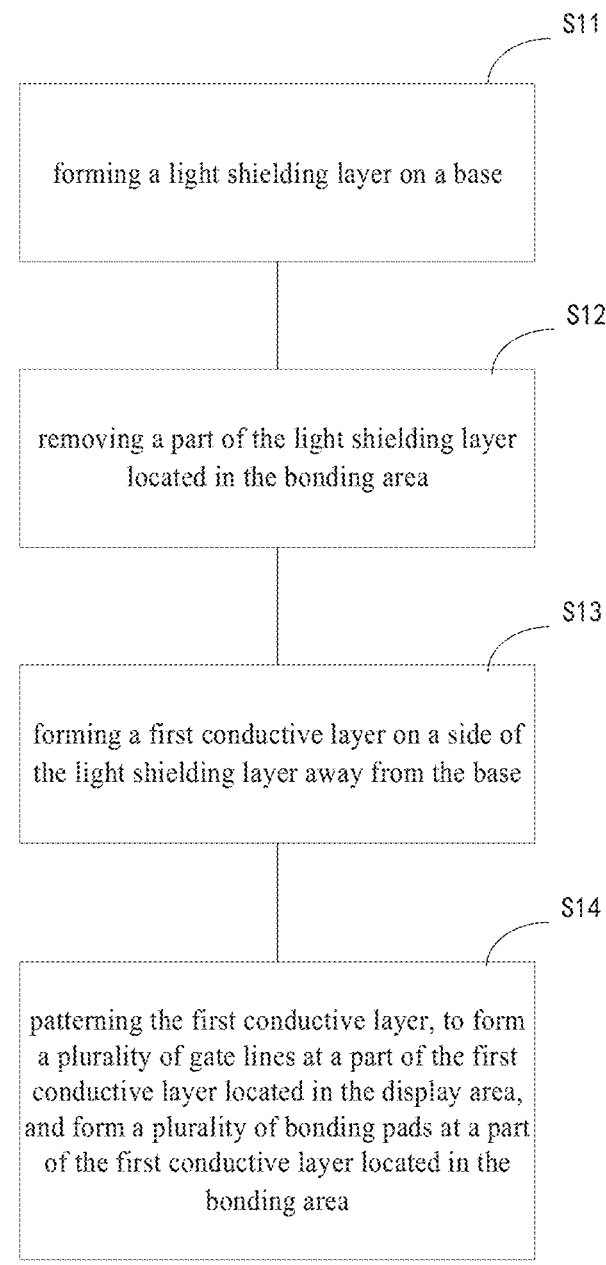
FIG. 12 is a flowchart of a method for manufacturing a display substrate according to an embodiment of the present disclosure.

In a second aspect, as shown in FIG. 12, an embodiment of the present disclosure further provides a method for manufacturing a display substrate, where the method in the present embodiment may be used to form the display substrate described above, and is described by taking the display substrate shown in FIG. 2 as an example, the film structure of the display substrate shown in FIG. 2 is described above, and details are not repeated here, and certainly, the structure of the display substrate formed by the method in the present embodiment is not limited to the display substrate shown in FIG. 2. The display substrate has a display area Q1, and a bonding area Q2 located on at least one side of the display area Q1, and may further have a frame sealing area Q3 disposed around the display area Q1, and the bonding area Q2 is disposed on at least one side of the frame sealing area Q3 away from the display area Q1.

Figure 13:
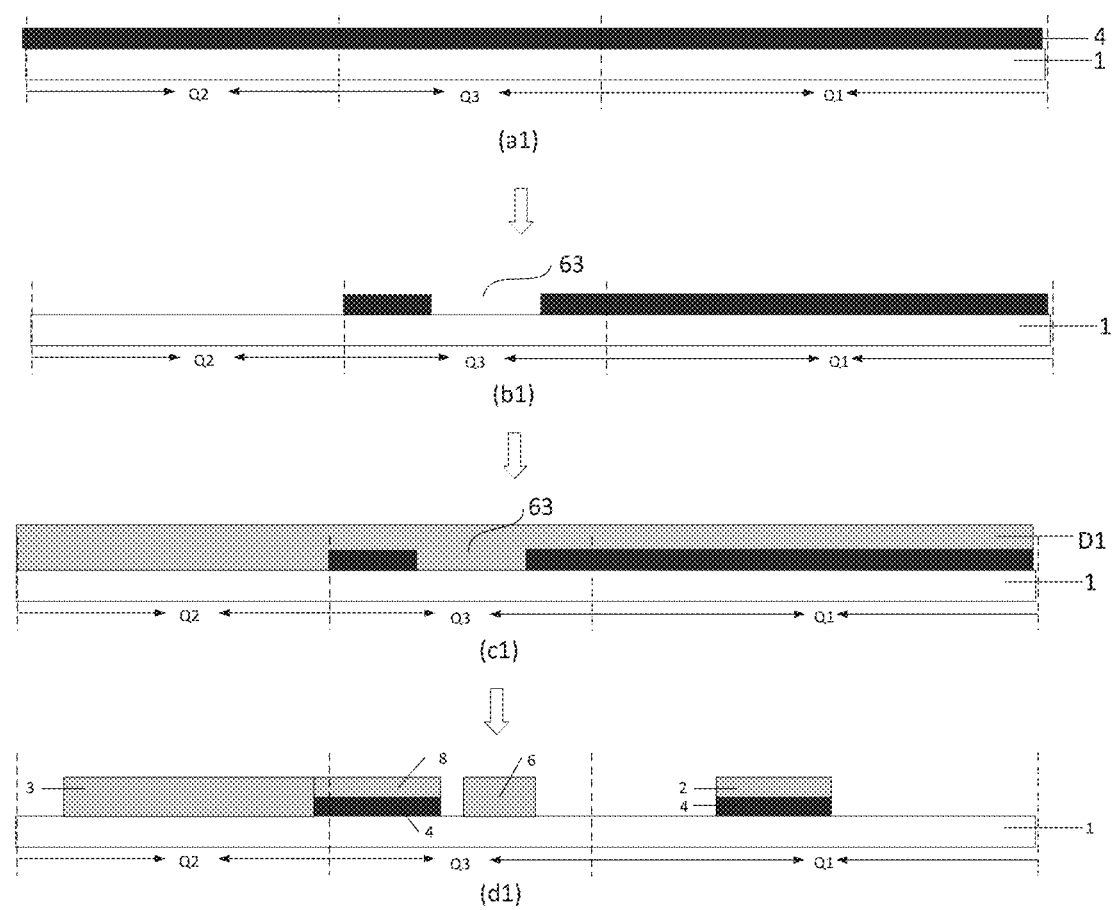
FIG. 13 is a schematic diagram (side view) illustrating a process for manufacturing a display substrate according to an embodiment of the present disclosure.
Figure 14:
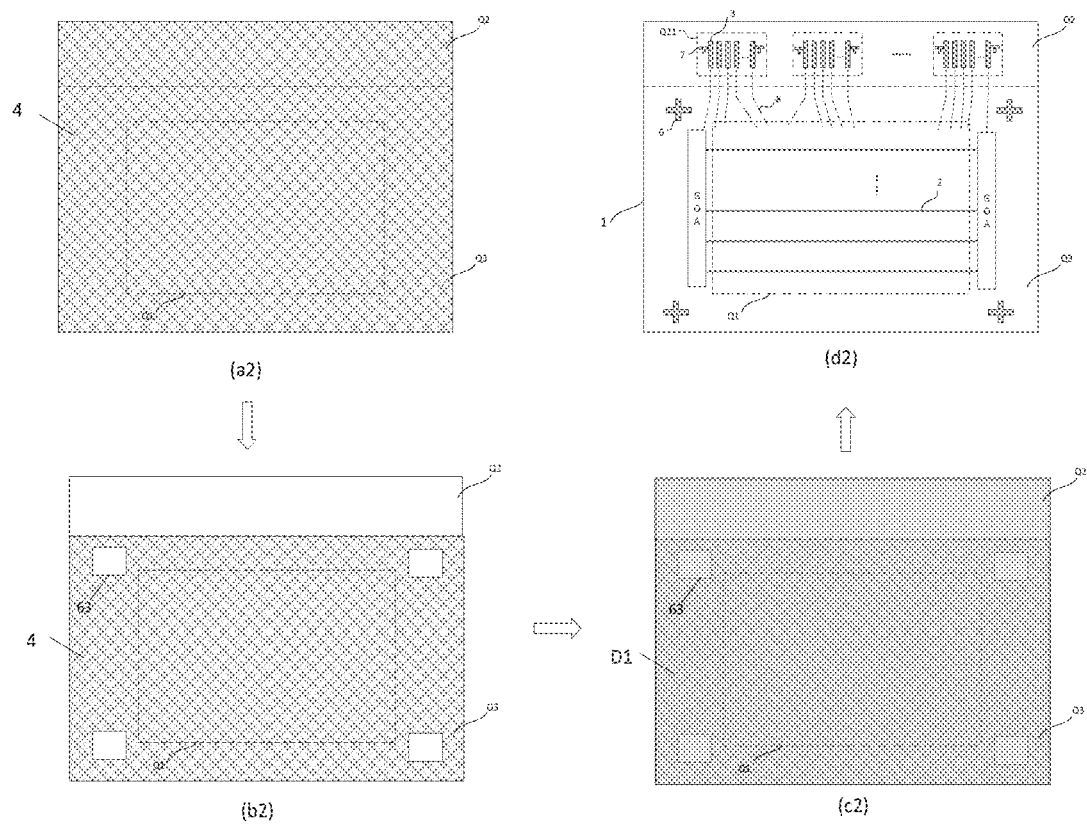
FIG. 14 is a schematic diagram (plan view) illustrating a process for manufacturing of a display substrate according to an embodiment of the present disclosure.

Referring to FIGS. 13 and 14, FIG. 13 is a side view illustrating a process for manufacturing the display substrate, and FIG. 14 is a plan view illustrating a process for manufacturing the display substrate and corresponding to that of FIG. 13, the method includes following steps S11 to S14.

S11, forming a light shielding layer 4 on a base 1.

Specifically, referring to FIG. 13(*a*1) and FIG. 14(*a*1), taking a case where the light shielding layer 4 is made of molybdenum oxide as an example, the molybdenum oxide is first sputtered on the base 1 by a sputter process to form the light shielding layer 4 covering the base 1.

S12, removing a part of the light shielding layer 4 located in the bonding area Q2.

Specifically, referring to (a1) to (b1) in FIG. 13, and (a2) to (b2) in FIG. 14, the light shielding layer 4 is preliminarily patterned through a mask, specifically, the part of the light shielding layer 4 covering the bonding area Q2 can be removed through exposure, development and etching processes, so as to form the light shielding layer 4 of the display substrate as shown in FIG. 14(b2), and no light shielding layer 4 is in the bonding area Q2, thereby preventing the light shielding layer 4 from affecting an identification of the bonding pads 3 in the bonding area Q2.

In some implementations, a plurality of first marks 6 may be arranged at positions of the base 1 corresponding to the frame sealing area Q3, the light shielding layer 4 being patterned includes removing the light shielding layer 4 at the positions where the first marks 6 are to be disposed in the frame sealing area Q3, that is, a plurality of hollow parts 63 are formed at the positions of the light shielding layer 4 where the first marks 6 are to be disposed, where each hollow part 63 is a position where the first mark 6 is subsequently formed, so as to ensure that there is no light shielding layer 4 between the first marks 6 and the base 1, and thus the first marks 6 can be identified from the side of the base 1 away from the first marks 6. It should be noted that, since the frame sealing area Q3 has an area through which a portion of the fan-out wires 8 passes, the part of the light shielding layer 4 located in the frame sealing area Q3 cannot be completely removed.

S13, forming a first conductive layer D1 on the side of the light shielding layer 4 away from the base 1.

Specifically, referring to (b1) to (c1) in FIG. 13, (b2) to (c2) in FIG. 14, a material layer of the first conductive layer D1 is sputtered on the side of the light shielding layer 3 away from the base 1, for example, a layer of conductive material such as copper, silver, molybdenum, niobium, etc., is sputtered, by a sputtering process, the first conductive layer D1 covers the display area Q2, and since the bonding pads 3 and the first marks 6 are also formed in the first conductive layer D1, the first conductive layer D1 also covers the frame sealing area Q3 and the bonding area Q2. Since the light shielding layer 4 is relatively thin, a slope of the light shielding layer 4 at an edge thereof proximal to the bonding area Q3 is relatively small, and thus a film formation quality of the first conductive layer D1 is not affected when the first conductive layer D1 is provided over the light shielding layer 4.

S14, patterning the first conductive layer D1, to form a plurality of gate lines 2 at a part of the first conductive layer D1 located in the display area Q1, and form a plurality of bonding pads 3 at a part of the first conductive layer D1 located in the bonding area Q2.

Specifically, referring to (c1) to (d1) in FIG. 13, (c2) to (d2) in FIG. 14, S14 may include:

exposing, developing and etching the first conductive layer D1, and the light shielding layer 4 disposed on the side of the first conductive layer D1 proximal to the base 1 and only in the display area Q1 by a mask made according to patterns of the gate lines 2 and the bonding pads 3, to form the gate lines 2 located in the display area Q1, the bonding pads 3 located in the bonding area Q2, the second marks 7 coupled to the bonding pads 3, and the first marks 6 located in the frame sealing area Q3. That is, the first conductive layer D1 and the light shielding layer 4 are etched through a single process using a same mask (e.g., a UV mask), if the material of the first conductive layer D1 includes copper or molybdenum niobium, and the material of the light shielding layer 4 includes molybdenum oxide, and an etching solution for copper or molybdenum niobium may also act on the molybdenum oxide, and thus the first conductive layer D1 and the light shielding layer 4 can be etched simultaneously in the display area Q1 to form the patterns of the gate lines 2 (e.g., patterns shown in (d2) in FIG. 14), and the bonding pads 3 (e.g., patterns shown in (d2) in FIG. 14) and the second marks 7 coupled to the bonding pads can be etched in the portion of the first conductive layer D1 located in the bonding area Q2 by using a same mask, and the first marks 6 (e.g., patterns shown in (d2) in FIG. 14) can be etched in the portion of the first conductive layer D1 located in the frame sealing area Q3. By etching the first conductive layer D1 and the light shielding layer 4 in a same process, a mask only used for etching the light shielding layer 4 can be omitted, and compared with a method in which the light shielding layer 4 is etched first and then the first conductive layer D1 is etched, the method provided by the embodiment of the present disclosure does not suffer from a problem that patterns may be misaligned due to drilling phenomenon in a case where the light shielding layer 4 is etched first and then the first conductive layer D1 is etched, and patterns of the gate lines 2 in the first conductive layer D1 can be overlapped with the pattern of the light shielding layer 4 on the side of the gate lines 2 proximal to the base 1 as much as possible, so that a precision of manufacturing is improved.

In some implementations, the display substrate provided in the embodiment further includes a plurality of fan-out wires 8 and a GOA circuit arranged in the frame sealing area Q2 disposed at an edge of the display area Q1, and the light shielding layer 4 is disposed below both the fan-out wires 8 and the GOA circuit, and thus, in S14, patterning the first conductive layer D1 further includes etching the first conductive layer D1 and the light shielding layer 4 simultaneously in the same process of etching the gate lines 2 by using the mask as above, so as to form patterns of the fan-out wires 8 and the GOA circuit in the frame sealing area Q2.

In some implementations, if the material of the first conductive layer D1 includes copper or molybdenum niobium, the material of the light shielding layer 4 includes molybdenum oxide, and the etching solution for copper or molybdenum niobium may also act on the molybdenum oxide, specifically, the etching solution for copper may include at least one of ammonium oxalate, hydrogen peroxide, and a surfactant, and certainly, the etching solution for copper may also include other components, which is not limited herein.

In some examples, referring to FIG. 2, the method for manufacturing the display substrate provided by the embodiment of the present disclosure further includes:

after patterning the first conductive layer D1, forming a gate insulating layer 01 on the side of the first conductive layer D1 (the layer where the bonding pads 3 and the gate lines 2 are located) away from the base 1; forming a film layer where the active layer 04 is located on a side of the gate insulating layer 01 away from the base 1, and patterning the film layer to form the active layer 04; forming a film layer where the source electrode 05 and the drain electrode 06 are located on a. side of the active layer 04 away from the base 1, patterning the film layer to form the source electrode 05, the drain electrode 06 and a plurality of data lines 5, the source electrode 05 and the drain electrode 06 are arranged in a same layer and are made of a same material; forming a planarization layer 03 on a side of the source electrode 05 and the drain electrode 06 away from the base 1, the planarization layer 03 may be an organic film (ORG film), and the planarization layer 03 flattens atop layer of the thin film transistors for facilitating to form a subsequent film layer; forming a pixel electrode 07 on a side of the planarization layer 03 away from the base 1, the pixel electrode 07 is coupled to the drain electrode 06 through a via hole in the planarization layer 03; forming a protective layer 02 on a side of the pixel electrode 07 away from the base 1, for protecting each film layer of the thin film transistors; forming a film layer where the auxiliary electrode 001 is located on a side of the protective layer 02 away from the base 1, patterning the film layer to form the auxiliary electrode 001, the auxiliary electrode 001 is provided with pixel openings P, and the auxiliary electrode 001 covers the gate lines 2 and the data lines 5; forming a film layer where the common electrode 002 is located on a side of the auxiliary electrode 001 away from the base 1, and patterning the film layer to form the common electrode 002 the common electrode 002 is provided with a plurality of slits 021 and pixel openings P, and the slits 021 are opposite to the pixel electrodes 06. Certainly, the structure of the display substrate is not limited to above, and for convenience of description, the above description is made only by taking the process for manufacturing the display substrate shown in FIG. 2 as an example.

Figure 15:
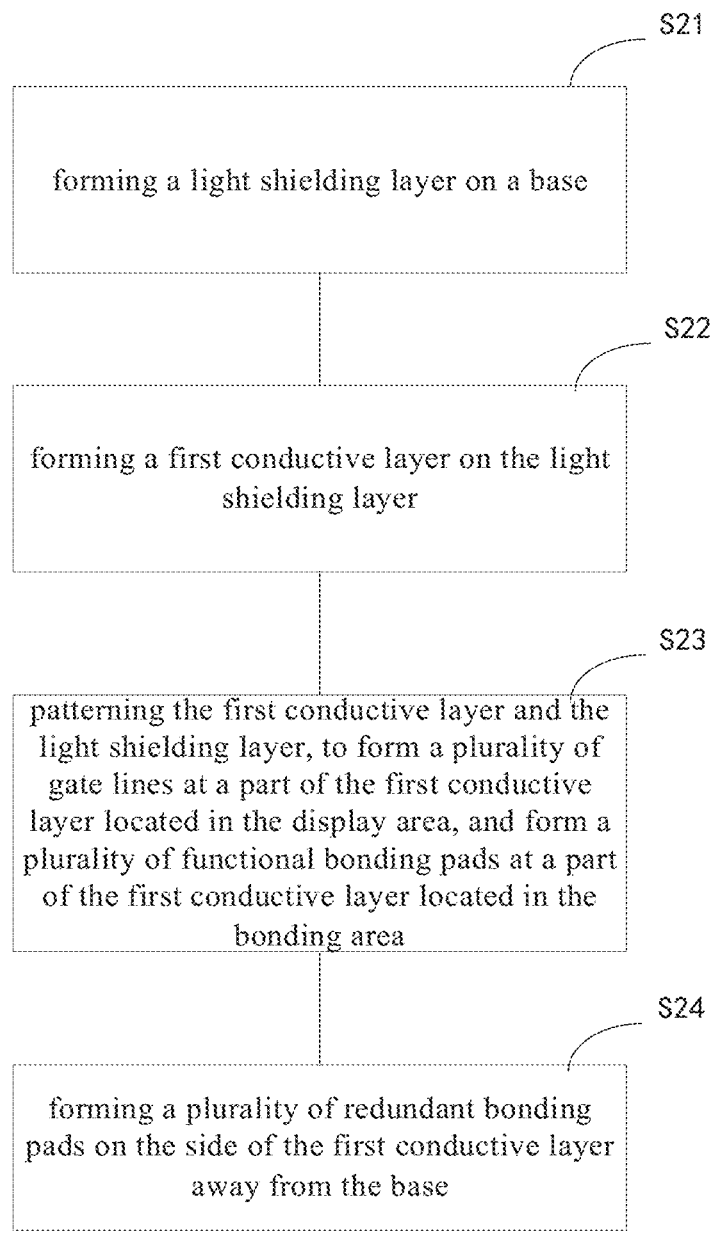
FIG. 15 is a flowchart of a method for manufacturing a display substrate according to an embodiment of the present disclosure.

In a third aspect, as shown in FIG. 15, an embodiment of the present disclosure further provides a method for manufacturing a display substrate, where the method for manufacturing the display substrate in the embodiment may be used to form the display substrate described above, and is described by taking forming the display substrate shown in FIG. 11 as an example, the film structure of the display substrate in FIG. 11 is described above and will not repeated here, and certainly, the structure of the display substrate formed by the method in the present embodiment is not limited to that of the display substrate shown in FIG. 11. The display substrate has a display area Q1, and a bonding area Q2 located on at least one side of the display area Q1, and may further have a frame sealing area Q3 disposed around the display area Q1, and the bonding area Q2 is disposed on at least one side of the frame sealing area Q3 away from the display area Q1. In the display substrate formed by the method of the present embodiment, a plurality of bonding pads 3 are formed in the bonding area, the bonding pads 3 include functional bonding pads 31 and redundant bonding pads 32, usually, external signals are only input into the functional bonding pads, that is, usually, pins of the connector are only coupled to the functional bonding pads 31, and the functional bonding pads 31 are further coupled to the data lines 5 or the GOA in the display area Q1, or coupled through the fan-out wires 8, and the redundant bonding pads 32 are dummy electrodes, and are not coupled to the pins of the connector, and do not receive any electrical signal.

Figure 16:
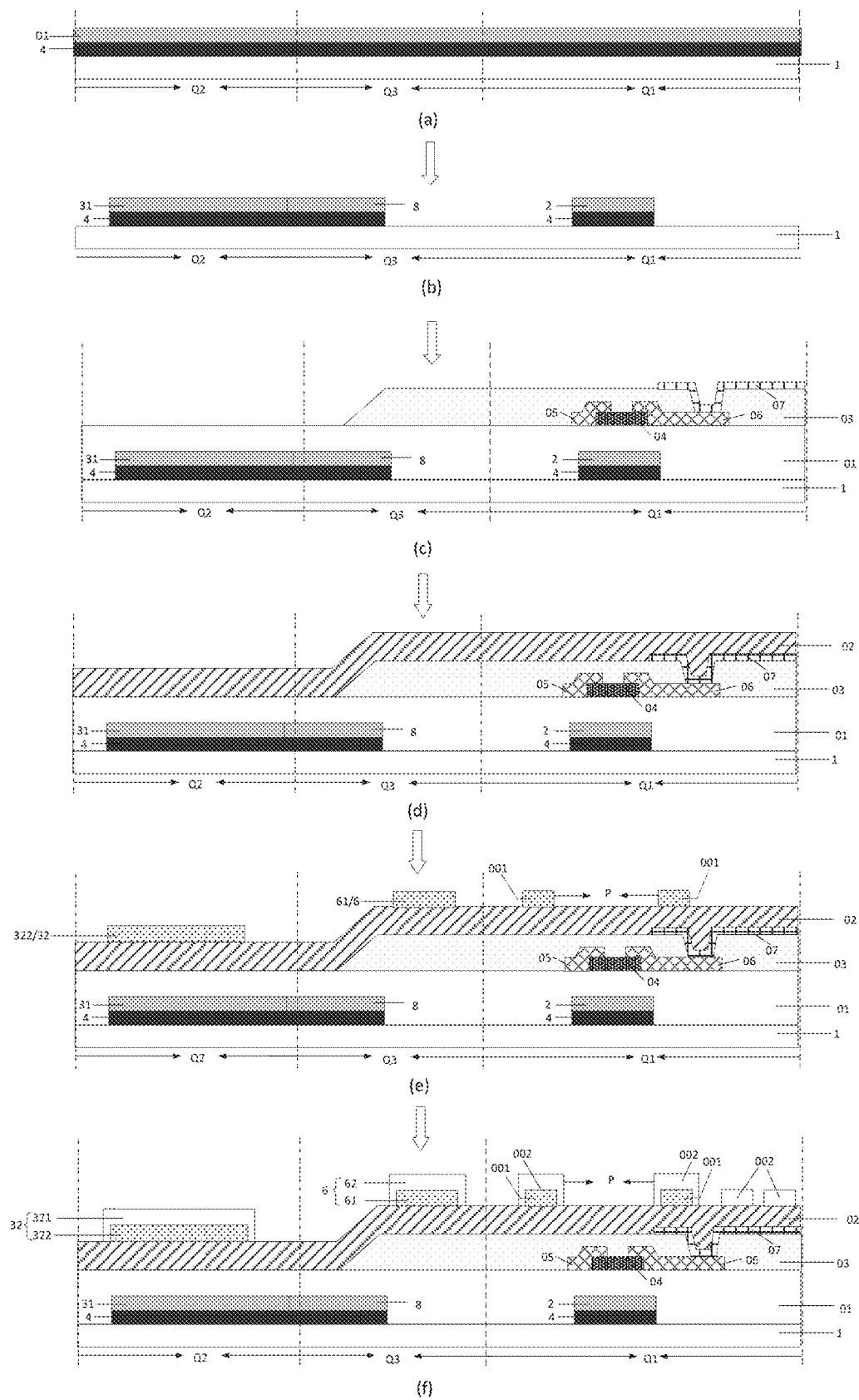
FIG. 16 is a schematic diagram (side view) illustrating a process for manufacturing a display substrate according to the embodiment of the present disclosure.

Referring to FIG. 16, FIG. 16 is a side view illustrating a process for manufacturing the display substrate, the method including following steps S21 to S24.

S21, forming a light shielding layer 4 on a base 1.

Specifically, referring to (a) in FIG. 16, taking a case where the light shielding layer 4 is molybdenum oxide as an example, molybdenum oxide is first sputtered on the base 1 by a sputter process to form the light shielding layer 4 covering the base 1.

S22, forming a first conductive layer D1 on a side of the light shielding layer 4 away from the base 1.

Specifically, referring to (a) in FIG. 16, taking the first conductive layer D1 as copper for example, copper is sputtered on the side of the light shielding layer 4 away from the base 1 to form the first conductive layer D1 covering the base 1.

S23, patterning the first conductive layer D1 and the light shielding layer 4, to form a plurality of gate lines 2 at a part of the first conductive layer D1 located in the display area Q1, and form a plurality of functional bonding pads 31 at a part of the first conductive layer D1 located in the bonding area Q2.

Specifically, referring to (a) to (b) in FIG. 16, the first conductive layer D1 and the light shielding layer 4 are patterned together by a mask made according to patterns of the gate lines 2 and the functional bonding pads 31, to form the gate lines in the display area Q1 and form the functional bonding pads 31 in the bonding area Q2 through exposure, development and etching processes.

In some implementations, the display substrate further includes a plurality of fan-out wires 8 and a GOA circuit disposed in the frame sealing area Q3, and when the first conductive layer D1 and the light shielding layer 4 are patterned together in S23, patterns of the fan-out wires 8 and the GOA circuit are further formed in the frame sealing area Q3. That is, after S23, the orthographic projection of the light shielding layer 4 on the base 1 only covers patterns of the gate lines, the functional bonding pads 31, the fan-out wires 8 and the GOA circuit.

As described above, by etching the first conductive layer D1 and the light shielding layer 4 in a same process, a mask only used for etching the light shielding layer 4 can be omitted, and compared with the method of etching the light shielding layer 4 first and then etching the first conductive layer D1, the method provided by the embodiment of the present disclosure does not suffer from a problem that patterns are misaligned due to drilling phenomenon when the light shielding layer 4 is etched first and the first conductive layer D1 is then etched, and patterns of the gate lines 2, the functional bonding pads 31, the fan-out wires 8 and the GOA circuit in the first conductive layer D1 can coincide with the pattern of the light shielding layer 4 as much as possible, thereby improving the accuracy of manufacturing.

Further, referring to (b) to (d) in FIG. 16, after S23 and before S24, the method for manufacturing the display substrate according to the embodiment of the present disclosure further includes:

forming a gate insulating layer 01 on the side of the first conductive layer D1 (the layer where the functional bonding pads 31 and the gate lines 2 are located) away from the base 1; forming a film layer where the active layer 04 is located on a side of the gate insulating layer 01 away from the base 1, and patterning the film layer to form the active layer 04; forming a film layer where the source electrode 05 and the drain electrode 06 are located on a side of the active layer 04 away from the base 1, patterning the film layer to form the source electrode 05, the drain electrode 06 and a plurality of data lines 5, the source electrode 05 and the drain electrode 06 are arranged in a same layer and are made of a same material; forming a planarization layer 03 on a side of the source electrode 05 and the drain electrode 06 away from the base 1, the planarization layer 03 may be an organic film (ORG film), and the planarization layer 03 flattens the top layer of the thin film transistors for facilitating to form a subsequent film layer; forming a pixel electrode 07 on a side of the planarization layer 03 away from the base 1, the pixel electrode 07 is coupled to the drain electrode 06 through a via hole in the planarization layer 03; and forming a protective layer 02 on a side of the pixel electrode 07 away from the base 1, for protecting each film layer of the thin film transistors.

S24, forming a plurality of redundant bonding pads 32 on a side of the first conductive layer D1 away from the base 1.

In some examples, the display substrate further includes: an auxiliary electrode 001 and a common electrode 002 arranged on the side of the first conductive layer D1 away from the base 1, and the auxiliary electrode 001 and the common electrode 002 are arranged successively along a direction away from base 1, and the auxiliary electrode 001 and the common electrode 002 are electrically coupled, specifically, the auxiliary electrode 001 and the common electrode 002 are arranged on a side of the protective layer 02 away from base 1, and the auxiliary electrode 001 is arranged on a side of the common electrode 002 proximal to base 1. The redundant bonding pad 32 include a first conductive part 321 and a second conductive part 322 disposed on the side of the first conductive layer D1 away from the base 1, and the first conductive part 321 is electrically coupled to the second conductive part 322, the first conductive part 321 and the common electrode 002 are disposed in a same layer and are made of a same material, and the second conductive part 322 and the auxiliary electrode 001 are disposed in a same layer and are made of a same material.

S24 may specifically include following S241 to S244.

S241, forming a second conductive layer on the side of the first conductive layer D1 away from the base.

Specifically, referring to (d) to (e) in FIG. 16, the second conductive layer is formed on the side of the first conductive layer D1 away from the base 1, and specifically, the second conductive layer where the auxiliary electrode 001 is located is formed on a side of the protective layer 02 (located on the side of the first conductive layer D1 away from the base 1) away from the base 1.

S242, patterning the second conductive layer to form the auxiliary electrode 001 at a part of the second conductive layer located in the display area Q1, and form the second conductive part 322 of the redundant bonding pad 32 at a part of the second conductive layer located in the bonding area Q2.

Specifically, referring to (d) to (e) in FIG. 16, the display substrate further includes a plurality of first marks 6 disposed in the frame sealing area Q3, and a plurality of second marks 7 (not shown in the figure) disposed in the bonding area Q2 and coupled to the functional bonding pads 31 or the redundant bonding pads 32, the first mark 6 include a third conductive part 62 and a fourth conductive part 61, and the second mark 7 include a fifth conductive part and a sixth conductive part. The second conductive layer is patterned through a mask according to the pattern of the auxiliary electrode 001, the patterns of the redundant bonding pads 32, the patterns of the first marks 6 and the patterns of the second marks 7, through exposure, development and etching processes, the pattern of the auxiliary electrode 001 is formed in the display area Q1 (as shown in FIG. 7), the auxiliary electrode 001 is provided with pixel openings P, and the auxiliary electrode 001 covers the gate lines 2 and the data lines 5; the pattern of the second conductive part 322 of the redundant bonding pad 32, the pattern of the sixth conductive part of the second mark 7 are formed in the bonding area Q2; the pattern of the fourth conductive part 61 of the first mark 6 is formed in the frame sealing area Q3.

S243, forming a third conductive layer on a side of the second conductive layer away from the base.

Specifically, referring to (e) to (f) in FIG. 16, the third conductive layer is formed on the side of the second conductive layer (the film layer where the auxiliary electrode 001 and the second conductive part 322 are located) away from the base 1, where the third conductive layer is the film layer where the common electrode 001 is located.

S244, patterning the third conductive layer to form a common electrode at a part of the third conductive layer in the display area, and form the first conductive part of the redundant bonding pad at a part of the third conductive layer in the bonding area.

Specifically, referring to (e) to (f) in FIG. 16, the second conductive layer is patterned by the same mask as that in S242 according to the pattern of the common electrode 002, the patterns of the redundant bonding pads 32, the patterns of the first marks 6 and the patterns of the second marks 7, through exposure, development and etching processes, the pattern of the common electrode 002 (as shown in FIG. 8) is formed in the display area Q1, where the common electrode 002 has pixel openings P and a plurality of slits 021, and the slits 021 are opposite to the pixel electrode 06; the pattern of the first conductive part 321 of the redundant bonding pad 32, the pattern of the fifth conductive part of the second mark 7 are formed in the bonding area Q2; and the third conductive part 62 of the first mark 6 is formed in the frame sealing area Q3.

It should be noted that the auxiliary electrode 001 is only disposed under a partial area of the common electrode 002, and the common electrode 002 wraps the auxiliary electrode 001, that is, the common electrode 002 covers a top surface and side surfaces of the auxiliary electrode 001, and thus in the process of manufacturing the display substrate, a film layer of the auxiliary electrode 001 is formed on the side of the protective layer 02 away from the base 1, the auxiliary electrode 001 is formed by patterning the film layer, then a film layer of the common electrode 002 is formed, and then the common electrode 002 is formed by patterning the layer, the patterning including exposure, development and etching processes, and since a developing solution for the common electrode 002 is corrosive to the auxiliary electrode 001, in order to prevent the developing solution from affecting the auxiliary electrode 001 during developing the common electrode 002, the common electrode 002 may wrap the auxiliary electrode 001. Certainly, the structure of the display substrate is not limited to above, and for convenience of description, the above description has been made only by taking the process for manufacturing the display substrate shown in FIG. 11 as an example.

In a fourth aspect, an embodiment of the present disclosure further provides a display device, which includes the display substrate described above. It should be noted that, the display device provided in the present embodiment may be: any product or component with a display function, such as a mobile phone, a tablet computer, a television, a display, a notebook computer, a digital photo frame, a navigator and the like. Other essential components of the display device are further included, which can be understood by those skilled in the art, and are not described herein, but should not be construed as limiting of the present disclosure.

In some implementations, the display device further includes a color filter substrate, the color filter substrate and the display substrate are aligned and combined, and liquid crystal is poured between the color filter substrate and the display substrate to form the liquid crystal display device. The color filter substrate includes color filters, and the color filters may include various types of color filters, for example, may include a quantum dot color filter.

It will be understood that the above embodiments are merely exemplary embodiments adopted to illustrate the principles of the present disclosure, and the present disclosure is not limited thereto. It will be apparent to those skilled in the art that various modifications and improvements can be made without departing from the spirit and scope of the present disclosure, and such modifications and improvements are also considered to be within the scope of the present disclosure.

The invention claimed is:

1. A display substrate, having a display area and a bonding area positioned on at least one side of the display area, the display substrate comprises:
   a base;
   a first conductive layer arranged on the base and positioned in the display area;
   the first conductive layer comprises a plurality of gate lines;
   a light shielding layer arranged on a side of the first conductive layer proximal to the base, and an orthographic projection of the light shielding layer on the base at least covers orthographic projections of the plurality of gate lines on the base; and
   a plurality of bonding pads arranged on the base at intervals and positioned in the bonding area;
   orthographic projections of at least a portion of the plurality of bonding pads on the base are not overlapped with the orthographic projection of the light shielding layer on the base,
   wherein the plurality of bonding pads comprises functional bonding pads and redundant b onding pads,
   orthographic projections of the redundant bonding pads on the base are at least partially not overlapped with the orthographic projection of the light shielding layer on the base, and
   orthographic projections of the functional bonding pads on the base are at least partially o verlapped with the orthographic projection of the light shielding layer on the base,
   the display substrate further comprises an auxiliary electrode and a common electrode ar ranged on a side of the first conductive layer away from the base, and the auxiliary electrode and the common electrode are sequentially arranged along a direction away from the base and are el ectrically coupled with each other, and orthographic projections of the auxiliary electrode and the common electrode on the base are at least partially overlapped with each other, wherein each of the plurality of redundant bonding pads comprises a first conductive part
   and a second conductive part which are arranged on the side of the first conductive layer away fr om the base, and are electrically coupled, the first conductive part and the common electrode are arranged in a same layer and are made of a same material, and the second conductive part and t he auxiliary electrode are arranged in a same layer and are made of a same material.

2. The display substrate of claim 1, wherein the functional bonding pads and the plurality of gate lines are arranged in a same layer and are made of a same material.

3. The display substrate of claim 1, further comprising: a plurality of fan-out wires spaced apart on the base, and each fan-out wire is coupled to one of the plurality of bonding pads, and the fan-out wires extend from the bonding area to the display area; the orthographic projection of the light shielding layer on the base covers orthographic projections of the plurality of fan-out wires on the base.

4. A method for manufacturing the display substrate of claim 1, the display substrate having the display area and the bonding area positioned on the at least one side of the display area;
   wherein the plurality of bonding pads comprise functional bonding pads and redundant bonding pads, the method comprises:
   manufacturing the light shielding layer on a the base;
   forming the first conductive layer on the light shielding layer;
   patterning the first conductive layer and the light shielding layer to form the plurality of gate lines at a part of the first conductive layer in the display area, and form a plurality of functional bonding pads at a part of the first conductive layer in the bonding area; and
   manufacturing the plurality of redundant bonding pads on a side of the first conductive layer away from the base, wherein each redundant bonding pad comprises the first conductive part and the second conductive part which are formed on the side of the first conductive layer away from the base and are electrically coupled;
   the manufacturing the plurality of redundant bonding pads on a side of the first conductive layer away from the base comprises: forming a second conductive layer on the side of the first conductive layer away from the base;
   patterning the second conductive layer to form the auxiliary electrode at a part of the second conductive layer in the display area, and form the second conductive part of the each of the plurality of redundant bonding pads at a part of the second conductive layer in the bonding area;
   forming a third conductive layer on a side of the second conductive layer away from the base; and
   patterning the third conductive layer to form the common electrode at a part of the third conductive layer in the display area, and form the first conductive part of the each of the plurality of redundant bonding pads at a part of the third conductive layer in the bonding area.

5. A display device, comprising the display substrate of claim 1.

6. The display substrate of claim 1, wherein the display substrate further has a frame sealing area disposed around the display area, the bonding area is disposed on at least one side of the frame sealing area away from the display area; the display substrate further comprises: a plurality of first marks disposed on the base and in the bonding area; wherein,
   orthographic projections of the first marks on the base are not overlapped with the orthographic projection of the light shielding layer on the base.

7. The display substrate of claim 6, wherein the plurality of first marks and the plurality of gate lines are disposed in a same layer and are made of a same material.

8. The display substrate of claim 6, wherein each of the plurality of first marks comprises a third conductive part and a fourth conductive part which are arranged on the side of the first conductive layer away from the base, and are electrically coupled, and the third conductive part and the common electrode are arranged in a same layer and are made of a same material; the fourth conductive part and the auxiliary electrode are arranged in a same layer and are made of a same material.

9. The display substrate of claim 6, further comprising:
   a plurality of fan-out wires spaced apart on the base, and each fan-out wire is coupled to one of the plurality of bonding pads, and the plurality of fan-out wires extend from the bonding area to the display area;
   the orthographic projection of the light shielding layer on the base covers orthographic projections of the fan-out wires on the base.

* * * * *